March 5, 1968 P. ZUK 3,372,070

FABRICATION OF SEMICONDUCTOR INTEGRATED DEVICES
WITH A PN JUNCTION RUNNING THROUGH THE WAFER

Filed July 30, 1965

INVENTOR
P. ZUK
BY H. W. Lockhart
ATTORNEY

United States Patent Office 3,372,070 Patented Mar. 5, 1968

3,372,070
FABRICATION OF SEMICONDUCTOR INTEGRATED DEVICES WITH A PN JUNCTION RUNNING THROUGH THE WAFER

Paul Zuk, Allentown, Pa., assignor to Bell Telephone Laboratories, Incorporated, New York, N.Y., a corporation of New York Filed July 30, 1965, Ser. No. 476,073
5 Claims. (Cl. 148—186)

Figure 1:
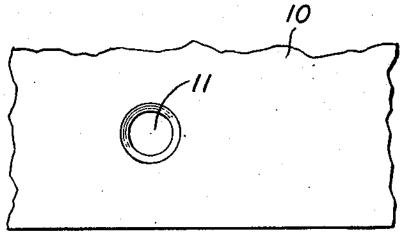

This invention relates to semiconductor devices, and particularly to those of the integrated circuit type.

In modern planar semiconductor technology with its increasing complexity of device fabrication, it is desirable to provide flexibility in such device fabrication. In particular, in many applications, it is advantageous to fabricate device structures on both sides of the semiconductor wafers. Consequently, there is a need for making electrical contact through the wafer from one major surface to the other at a number of circuit points. There is need also, for easily fabricated and reliable stand-off contacts for integrated circuits to enable mounting to substrates.

Accordingly, an object of this invention is improved semiconductor devices, and particularly, improved integrated circuits.

An ancillary object of this invention is to facilitate the fabrication of through-contacts and stand-off contacts on semiconductor devices.

In accordance with a specific embodiment of this invention a hole or a plurality of holes is made through a slice of oxide-coated semiconductor material. The slice then is subjected to a solid state diffusion treatment, the effect of which is confined to the unoxided, that is, unmasked portions of the slice, chiefly the walls of the holes. This diffusion converts a zone of the material surrounding each hole to a very low resistivity value and of a conductivity type opposite to that of the adjoining material. Thus, a PN junction barrier is produced which, under operating conditions, provides the necessary electrical isolation.

Next, the slice is remasked with oxide, if necessary, to insure that substantially only the walls of the holes are unmasked. The slice then is placed in a suitable apparatus in which epitaxial deposition of the semiconductor material within the holes is accomplished. The deposited material is of the same conductivity type as that of the diffused low resistivity wall portions of the slice. This epitaxial growth of semiconductor material is arranged so as to continue until the hole or holes is completely filled, after which growth continues outwardly from the holes over a restricted area adjoining the hole, thus forming a pedestal portion. In this manner there is formed a portion of low resistivity material penetrating through the slice, suitable for use as a conductive channel from one surface to the other, and further extending outwardly as a pedestal portion useful both to mount and to interconnect the completed device on a base or substrate. Typically, the mounting base or substrate contains a conductive circuit pattern to which the semiconductor integrated circuit may be connected.

The provision of the through connections in the slice enables the fabrication of individual circuit components on both faces of the slice material inasmuch as these components may be interconnected readily by such through-contacts. Also, components on the lower major surface are spaced away from the substrate by means of the pedestal portions extending outwardly from each through-contact.

Accordingly a feature of this invention is that the through-contact and pedestal-contact structure may be fabricated utilizing procedures currently available in the semiconductor art including diffusion and epitaxial deposition.

Figure 2:
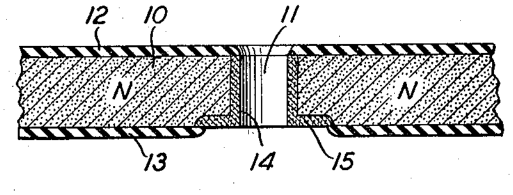
Figure 3:
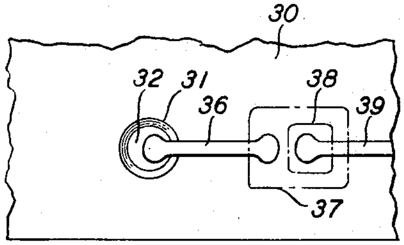
Figure 4:
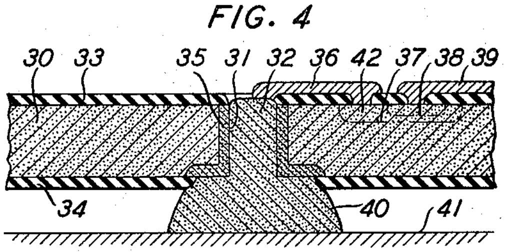

The invention and its object and features may be more clearly understood from the following detailed description taken in connection with the drawing in which:

FIGS. 1 and 2, respectively, show plan and cross section views of a portion of a semiconductor slice in the initial steps of fabrication of a single through-contact;

FIGS. 3 and 4, respectively, are plan and cross section views at a later stage of fabrication of a through-contact and a pedestal-contact in a portion of a semiconductor slice in accordance with this invention; and FIGS. 5 and 6, respectively, again are similar plan and cross section views of a more complex semiconductor integrated circuit device illustrating the principles of this invention.

The following description is in terms of a portion of a semiconductor slice, and it will be understood, exemplifies the practice of the invention which may be repeated within a semiconductor slice to provide a plurality of through-contacts and pedestal-contacts. Referring to FIGS. 1 and 2, a portion of semiconductor slice 10 is perforated by a hole defined by the walls 11. Such holes may be formed in semiconductor slices by any one of several well-known techniques including etching, ultrasonic cutting, electron beam boring, as well as by the use of a laser beam. It will be understood that an array of holes may be formed in accordance with the circuit pattern to be produced within the semiconductor slice. An oxide-coating 12 is produced over the entire upper surface of the slice while a similar oxide-coating 13 is formed on the lower surface except for a portion 15 peripheral to the hole. In this specific embodiment, the original semiconductor slice 10 is of N-type conductivity. The masked and perforated slice is subjected to a solid state diffusion treatment using a strong acceptor type impurity such as boron which penetrates the zone 14 surrounding the walls 11 of the slice, converting it to P-type conductivity material of relatively low resistivity. In some instances, it is advantageous to convert this zone 14 to material of a degenerate grade. It will be noted that the diffused zone 14 extends along the unmasked peripheral region 15 on the lower face of the slice.

Referring now to FIGS. 3 and 4, the semiconductor slice is shown at a later stage of fabrication. The hole has been filled with P-type conductivity semiconductor material 32 by epitaxial deposition in accordance with well-known techniques. In connection with this step, it is necessary only to mask, using silicon oxide, those portions of the slice upon which epitaxial growth is not wanted. In particular, the silicon oxide is a suitable mask inasmuch as it tends to reject deposition of silicon semiconductor material.

The epitaxial growth occurs from the upper surface of the slice to the lower and then continues outwardly from the lower face adjoining the hole to produce the pedestal portion 40. This procedure is readily achieved by properly positioning the slice and covering the upper surface of the slice to prevent deposition thereon. Epitaxial deposition techniques are well known, as disclosed, for example, in Patents 3,142,596 and 3,165,811 to H. C. Theuerer.

Subsequent to the formation by epitaxial deposition of the through-contact 32 and its pedestal portion 40, individual components are fabricated within the slice in accordance with well-known planar semiconductor methods. For example, conductivity zones of a transistor are formed by oxide-masked diffusion to produce PN junctions 37 and 38. Connection to the resulting conductivity type zones is made by the deposited metal connectors 36 and 39 on the upper surface of the slice. Thus, it will be noted, by way of example, that connection is provided from the zone 42 through the connector 36, then by way of the through-contact 32 and pedestal portion 40 to the mounting platform 41.

Figure 5:
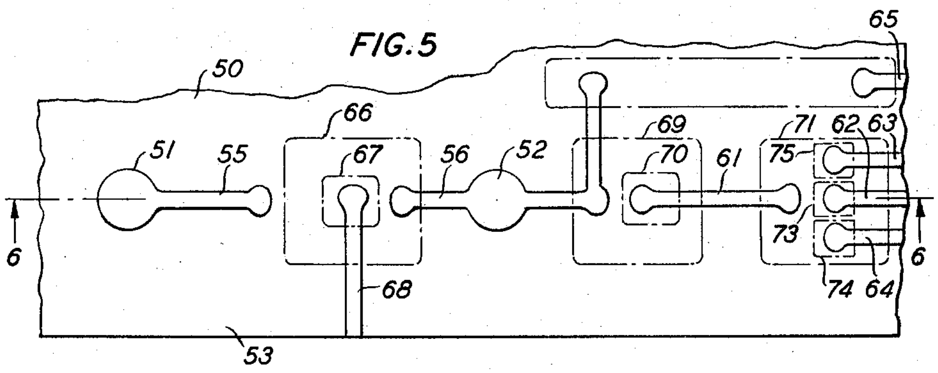
Figure 6:
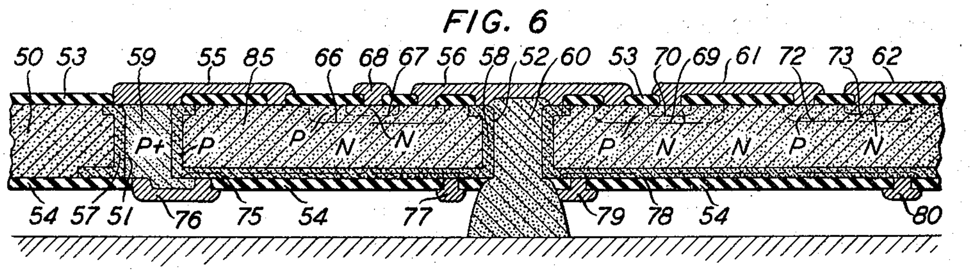

In FIGS. 5 and 6 further examples are shown of possible arrangements of through-contacts and pedestal-contacts in accordance with this invention, as applied to a portion of an integrated circuit. Referring particularly to the sectional view (FIG. 6), a portion of a slice of semiconductor material is shown wherein a pair of holes 51 and 52 are provided through the slice, but only one of the holes 52 is fabricated to have a pedestal-contact. The hole 51 is filled with material to form through-contact 59. This contact 59 enables connection from N-type conductivity zone 85 by way of the metal conductor 55, through-contact 59, and the metal conductor 76, to a diffused resistance element 75 formed in the lower surface of the slice. The other terminal connection to the resistance element 75 is by means of a deposited metal conductor 77 which, although not shown in the drawing, may connect to other components within the integrated circuit.

Similarly, in the right-hand portion of the slice, another resistance element 78 is diffused in the lower surface and one terminal 79 of this resistance element 78 is directly connected to the pedestal-contact 60.

The particular arrangement of this device as depicted in the plan view of FIG. 5 is exemplary and merely intended to illustrate the type of interconnection to which the method and structure in accordance with this invention may be applied. In particular, the broken lines 69 and 70 indicate the boundary of diffused regions which may constitute transistor structures and the boundaries 73, 74 and 75 represent portions of diodes of the type used for fan-out and fan-in arrangements for logic circuits.

From the foregoing, it will be apparent that the methods in accordance with this invention provide a relatively simple and straightforward structure enabling facile contact between the opposite major surfaces of a slice as well as means for making a stand-off electrical connection to mounting platforms.

The advantages of the techniques disclosed herein over the previous through-contact arrangement using a diffused region through the slice are apparent to one skilled in the art. The method in accordance with this invention avoids either the lengthy deep diffusion heat treatments required to penetrate the slice of normal thickness or, in the alternative, the fragility of thinner slice materials resorted to in order to avoid the deep diffusions. Moreover, the techniques, from a quality control standpoint, are clean and compatible with the other planar device fabrication steps.

Although the invention has been disclosed in terms of certain specific embodiments, it will be understood that other arrangements may be devised by those skilled in the art which likewise fall within the scope and spirit of the invention.

What is claimed is:

1. The method of fabricating a semiconductor device including the steps of forming a slice of semiconductor material, perforating said slice to form at least one hole therethrough, said hole having a wall, diffusing a significant impurity through the wall of said hole to alter the conductivity of a zone adjoining said wall, vapor-depositing semiconductor material of the same conductivity type as the diffusant impurity upon said wall and within said hole and extending outwardly from at least one end of said hole, thereby to produce a pedestal portion of said semiconductor material.

2. The method of fabricating a semiconductor device including the steps of forming a slice of semiconductor material, perforating said slice to form a series of holes therethrough, said holes having walls, diffusing a significant impurity into the walls of said holes to alter the conductivity of a zone adjoining each said wall, vapor-depositing semiconductor material of the same conductivity type as the diffusant impurity upon said walls and within said holes and extending outwardly from at least one end of at least one of said holes, thereby to produce a pedestal portion of said semiconductor material.

3. The method of fabricating a semiconductor device including the steps of forming a slice of semiconductor material, perforating said slice to form at least one hole therethrough, said hole having a wall, diffusing a significant impurity into the wall of said hole to alter the conductivity of a zone adjoining said wall, vapor-depositing said semiconductor material of the same conductivity type as said diffusant impurity upon said wall and within said hole, thereby to form a through-contact, forming a plurality of conductivity-type zones in portions of said slice, and forming conductive interconnecting members on at least one major surface of the slice including at least one interconnection terminating at one end of said through-contact.

4. The method of fabricating a semiconductor device including the steps of forming a slice of semiconductor material predominantly of one conductivity type, perforating said slice to form a series of holes therethrough, said holes having walls, diffusing a significant impurity of the opposite conductivity type into the walls of said holes to convert the conductivity type of the zone adjoining said wall, vapor-depositing semiconductor material of said opposite conductivity type upon said walls and within said hole and extending outwardly from at least one end of at least one of said holes, thereby to produce a through-contact and a pedestal-contact of said semiconductor material of said opposite conductivity type.

5. The method of fabricating a semiconductor device including the steps of forming a slice of semiconductor material predominantly of one conductivity type, perforating said slice to form a series of holes therethrough, said holes having walls, diffusing a significant impurity of the opposite conductivity type into the walls of said holes to alter the conductivity type of the zone adjoining said wall, vapor-depositing semiconductor material of said opposite conductivity type upon said walls and within said hole and extending outwardly from at least one end of at least one of said holes, thereby to produce a through-contact and a pedestal-contact of said semiconductor material of said opposite conductivity type, forming within said slice a plurality of conductivity type zones defining successive PN junctions, depositing selectively on at least one major surface of said slice a plurality of conductive metal interconnections, at least one of said interconnections terminating at one of said through-contacts.

References Cited

UNITED STATES PATENTS

| | | | |
|---|---|---|---|
| 3,008,089 | 11/1961 | Uhlir | 148—33.2 |
| 3,044,909 | 7/1962 | Shockley | 148—187 |
| 3,243,323 | 3/1966 | Corrigan | 148—187 |

HYLAND BIZOT, *Primary Examiner*.